(12) United States Patent
Chang et al.

(10) Patent No.: US 8,906,710 B2
(45) Date of Patent: Dec. 9, 2014

(54) MONITOR TEST KEY OF EPI PROFILE

(75) Inventors: Chih-Sheng Chang, Hsin-Chu (TW);
Chia-Cheng Ho, Hsin-Chu (TW);
Yi-Tang Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 534 days.

(21) Appl. No.: 13/336,306

(22) Filed: Dec. 23, 2011

(65) Prior Publication Data
US 2013/0166248 A1    Jun. 27, 2013

(51) Int. Cl.
*H01L 21/66*    (2006.01)

(52) U.S. Cl.
USPC .............................. 438/17; 702/166; 324/699

(58) Field of Classification Search
CPC ................. H01L 21/67253; H01L 21/823431; H01L 22/20; H01L 22/24; Y10S 438/907
USPC ........................ 324/699; 702/166; 438/14, 17; 257/E21.521, E21.53
See application file for complete search history.

(56) References Cited

U.S. PATENT DOCUMENTS 6,521,910 B1 * 2/2003 Lin ................................. 257/48
7,560,946 B2 * 7/2009 Bickford et al. ............ 324/750.3
7,908,109 B2 * 3/2011 Good et al. .................... 702/117
2004/0132224 A1 * 7/2004 Tsukiyama et al. ............ 438/14
2005/0148104 A1 * 7/2005 Kota et al. ...................... 438/14

FOREIGN PATENT DOCUMENTS

| CN | 2011-228722 | 11/2011 |
| JP | 2008-177476 | 7/2008 |
| KR | 2002-0091890 | 12/2002 |
| KR | 10 20050081264 A | 8/2005 |

* cited by examiner

*Primary Examiner* — Shaun Campbell
(74) *Attorney, Agent, or Firm* — Slater & Matsil, L.L.P.

(57) ABSTRACT

A method and apparatus for estimating a height of an epitaxially grown semiconductor material in other semiconductor devices. The method includes epitaxially growing first, second, and third portions of semiconductor material on a first semiconductor device, measuring a height of the third portion of semiconductor material and a height of the first or second portion of semiconductor material, measuring a first saturation current through the first and second portions of semiconductor material, measuring a second saturation current through the first and third portions of semiconductor material, and preparing a model of the first saturation current relative to the height of the first or second portion of semiconductor material and the second saturation current relative to an average of the height of the first and third portions of semiconductor material. The model is used to estimate the height of an epitaxially grown semiconductor material in the other semiconductor devices.

19 Claims, 7 Drawing Sheets

MONITOR TEST KEY OF EPI PROFILE

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (FinFETs) or multiple gate transistors will be used in sub 32 nm transistor nodes. For example, FinFETs not only improve areal density but also improve gate control of the channel.

In constructing three-dimensional FinFETs, an epitaxially grown layer of semiconductor material ("epi layer") is generally grown on a semiconductor substrate. Because the thickness of the epi layer (i.e., the height that the epi layer rises above the semiconductor substrate) affects the performance of the FinFET, growth of the epi layer is, if possible, precisely controlled.

The rate at which an epi layer grows in or proximate different environments (e.g., on silicon, adjacent to a shallow trench isolation (STI) region, proximate a silicon nitride, etc.) varies significantly. In order to determine if an epi layer has grown to an expected, desired, or acceptable thickness, a transmission electron microscope (TEM) may be used and thickness measurements taken. However, using the TEM is costly. Therefore, using the TEM sparingly may be desired. In addition, using the TEM to take measurements may slow down the overall FinFET production process. Moreover, the TEM is unable to observe variations within the die without taking an extensive number of measurements.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable concepts that can be embodied in a wide variety of contexts. The embodiments discussed are merely illustrative of ways to make and use the disclosure, and do not limit the scope of the disclosure.

The present disclosure will be described with respect to embodiments in a context, namely a FinFET metal oxide semiconductor (MOS). The disclosure may also be applied, however, to other integrated circuits, electronic structures, and the like.

Figure 1:
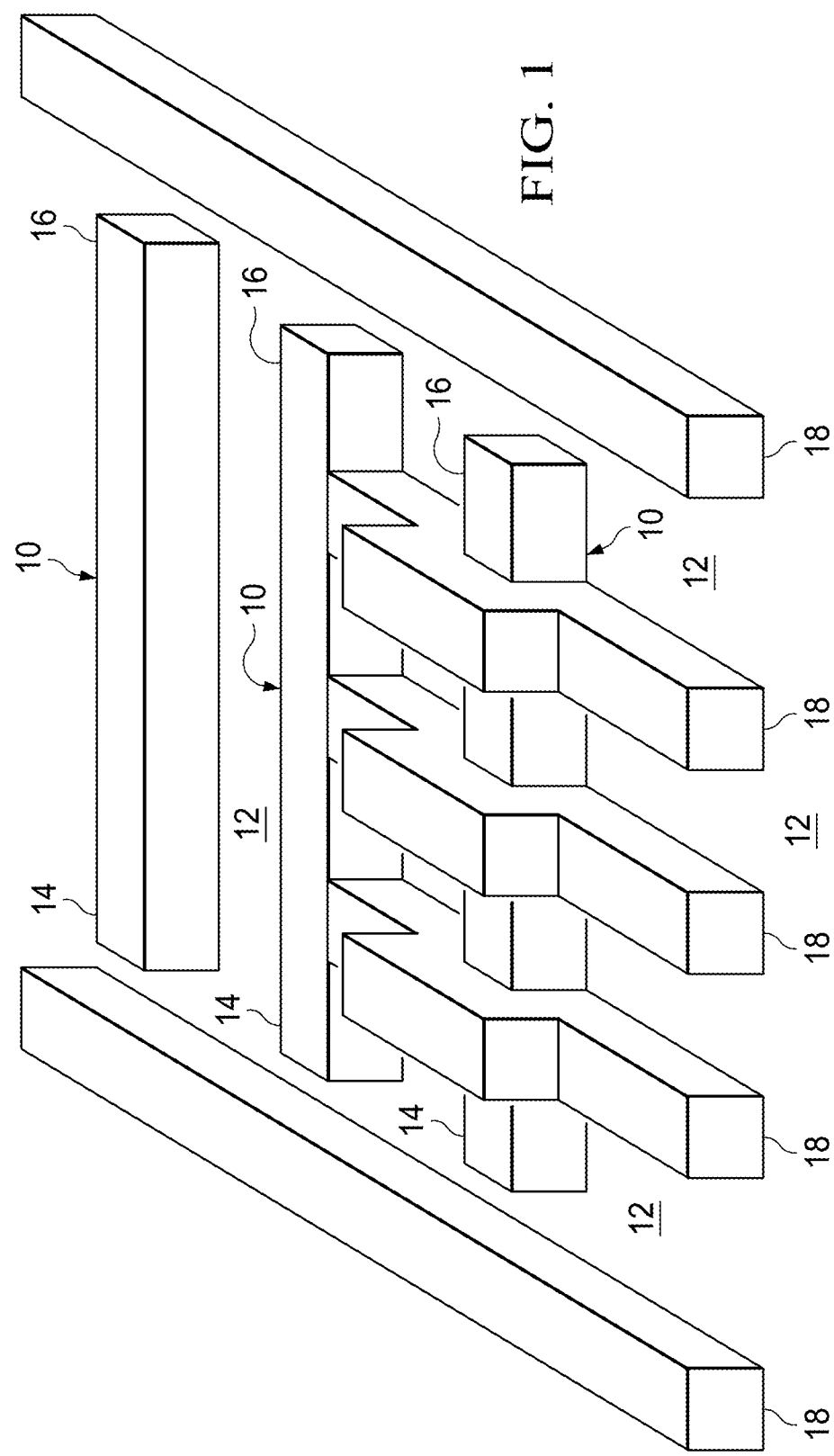
FIG. 1 is a perspective view of semiconductor fins.

Referring now to FIG. 1, several fins 10 projecting from, for example, a shallow trench isolation (STI) region 12 are illustrated. Each of the fins 10 is formed from a semiconductor material and defines a first end 14 and a second end 16. In some embodiments, the fins 10 are oriented parallel to one another. While three of the fins 10 are illustrated in FIG. 1, more or fewer fins may be used. By way of example, in one embodiment a total of six fins 10 are employed. In some embodiments, the height that the fins 10 project above the STI region 12 is about 20 nm to about 60 nm.

Still referring to FIG. 1, gate electrodes 18 are formed over the fins 10. Gate electrodes 18 are also formed beyond, and spaced apart from, the first and second ends 14, 16 of the fins 10. In some embodiments, the gate electrodes 18 are formed from polysilicon. In some embodiments the gate electrodes 18 are oriented transverse or perpendicular to the fins 10. While three gate electrodes 18 disposed over the fins 10 are illustrated in FIG. 1, more or fewer gate electrodes may be used. By way of example, in one embodiment a total of five gate electrodes 18 are employed. The gate electrodes 18 may be formed through a masking and etching process.

Figure 2:
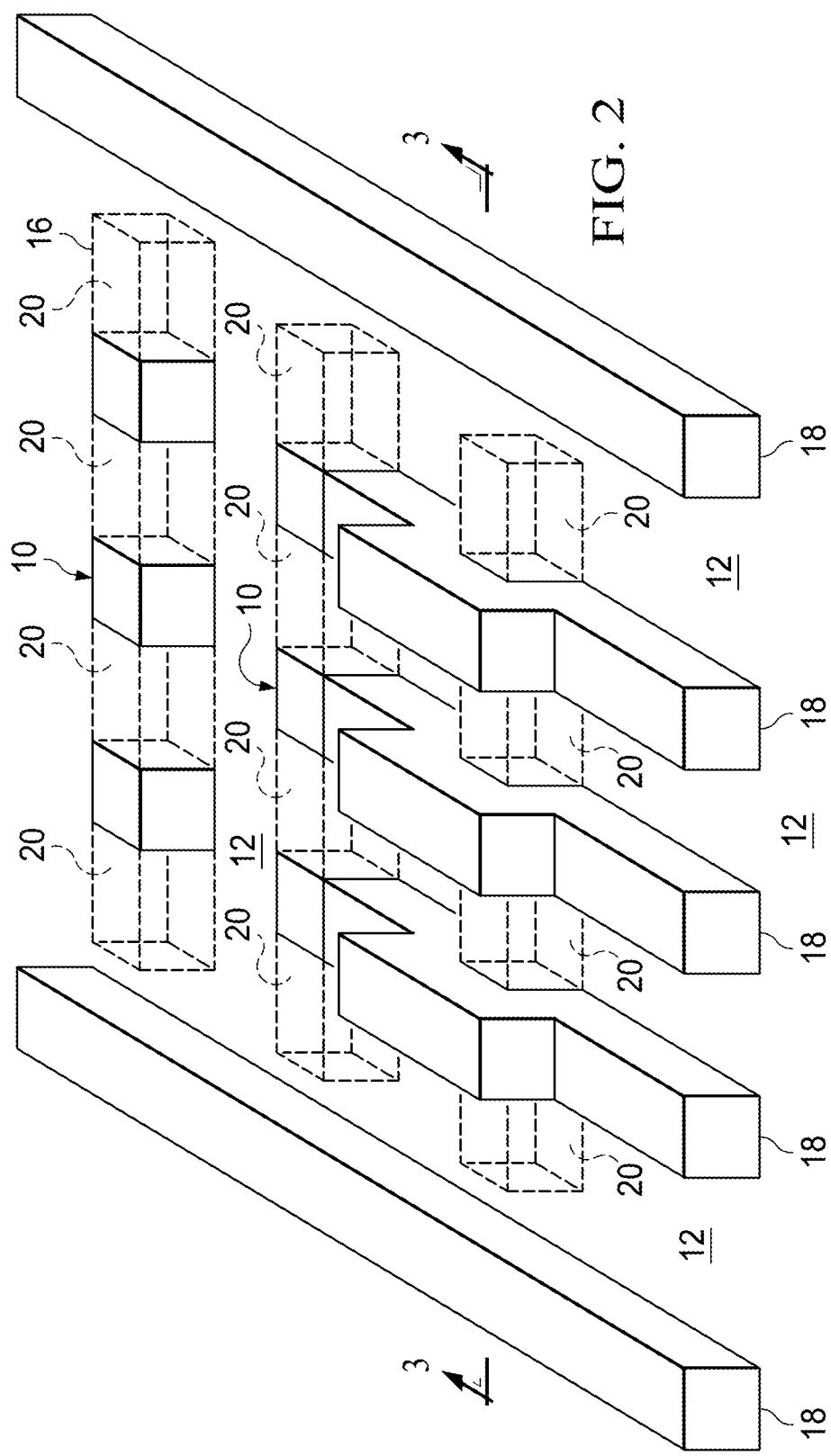
FIG. 2 is a perspective view of recesses formed in the fins of FIG. 1.

Referring now to FIGS. 2, recesses 20 are formed in the fins 10 of FIG. 1. While each of the fins 10 illustrated in FIG. 1 is provided with four recesses 20, more or fewer recesses may be used in other embodiments. In addition, the recesses 20 may have shapes, sizes, configurations, and dimensions that are different than those depicted in FIG. 2. The recesses 20 in the fins 10 may be formed through a masking and etching process. In some embodiments, the recesses 20 are about 20 nm to about 60 nm deep.

Figure 3:
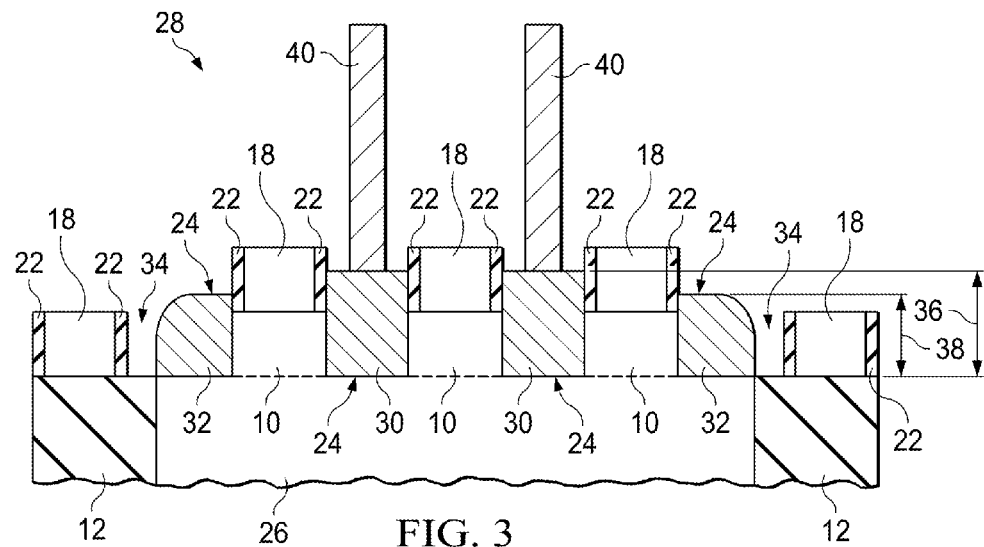
FIG. 3 is a cross sectional view of a first FinFET device, taken generally along line 3-3 in FIG. 2, after the recesses have been filled with epitaxially-grown semiconductor material and contacts have been added in a first configuration.

Referring now to FIG. 3, in some embodiments a dielectric layer 22 (i.e., a spacer) is formed on opposing sides of the gate electrodes 18. The dielectric layer 22 may be formed through a masking and etching process. The dielectric layer 22 may be formed from a common dielectric material such as an oxide, a nitride, an oxynitride, a high-K dielectric like $Ta_2O$, $Al_2O_3$, HfO, $SiTiO_3$, HfSiO, HfSiON, ZrSiON, and combinations thereof.

Still referring to FIG. 3, a semiconductor material 24 is epitaxially grown upon a substrate 26 and within the recesses 20 of the fins 10 in order to form a first FinFET device 28. As shown in FIG. 3, larger portions 30 of semiconductor material 24 grow proximate the center of the first FinFET device 28. In contrast, smaller portions 32 of the semiconductor material 24 grow closer to the outside edges of the first FinFET device 28.

The smaller portions 32 have a reduced size relative to the larger portions 30 due to the smaller portions being adjacent, or exposed to, an environment 34 or material that inhibits or prevents epitaxial growth. In some embodiments, the environment 34 or material inhibiting or preventing epitaxial growth is, for example, the STI region 12, a silicon nitride material, an empty space, or some combination thereof. Those skilled in the art will recognize that the smaller portions 32 of semiconductor material 24 may have a variety of irregular or non-uniform shapes relative to the larger portions 30.

In some embodiments, a height 36 of the larger portions 30 of semiconductor material 24 in the first FinFET device 28 is about 34 nm to about 74 nanometers. In addition, a height 38 of the smaller portions 32 of semiconductor material 24 proximate the outer edges of the first FinFET device 28 is less than the height 36 of the larger portions 30.

Figure 4:
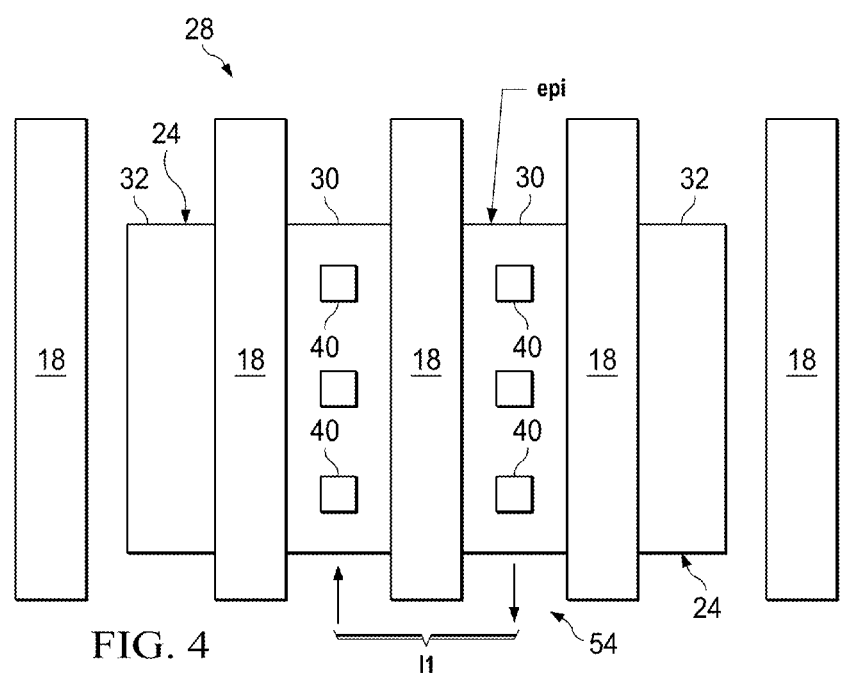
FIG. 4 is a plan view of the FinFET of FIG. 3 further illustrating an orientation of the contacts.

Referring now to FIGS. 3-4, contacts 40 are electrically coupled to the large portions 30 of semiconductor material 24 in the first FinFET device 28. The contacts 40 may be used to measure a current passing through the larger portions 30 of semiconductor material 24. In some embodiments, the contacts 40 are formed from tungsten plugs.

Figure 5:
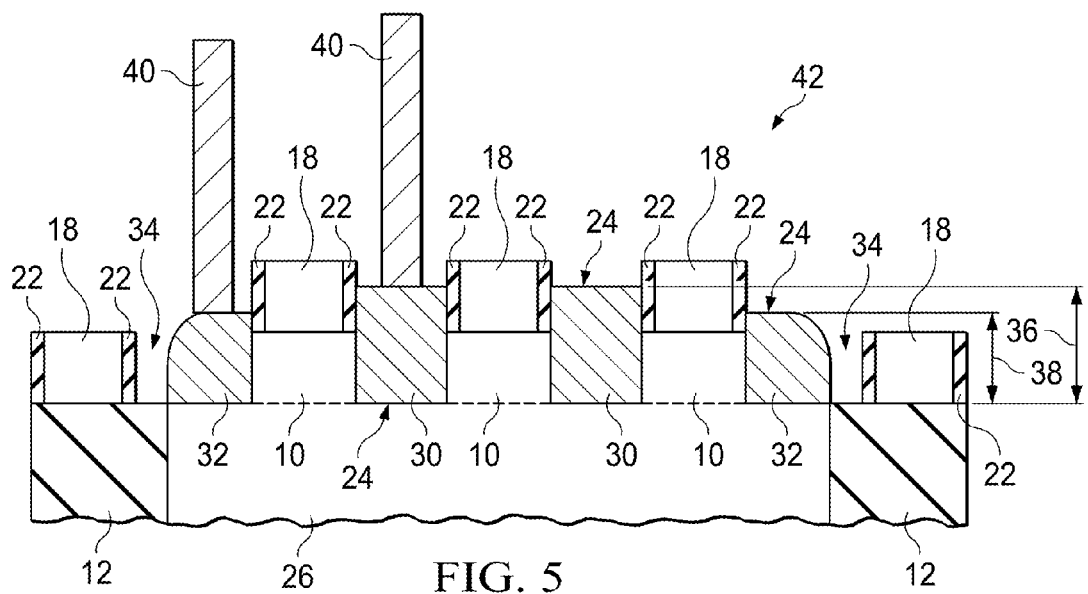
FIG. 5 is a cross sectional view of a second FinFET device constructed in a manner similar to the FinFET device of FIG. 3 but with contacts in a second configuration.

Referring now to FIG. 5, a second FinFET device 42 similar to the first FinFET device 28 of FIG. 3 is illustrated. Like the first FinFET device 28, the second FinFET device 42 includes both larger and smaller portions 30, 32 of semiconductor material 24. In some embodiments, the height 36 of the larger portions 30 of semiconductor material 24 in the first FinFET device of FIG. 3 is the same or similar to the height 36 of the larger portions 30 of semiconductor material 24 in the second FinFET device 42 of FIG. 5. Likewise, the height 38 of the smaller portions 32 of semiconductor material 24 in the first FinFET device 28 of FIG. 3 is the same or similar to the height 38 of the smaller portions 32 of semiconductor material 24 in the second FinFET device 42 of FIG. 5.

Figure 6:
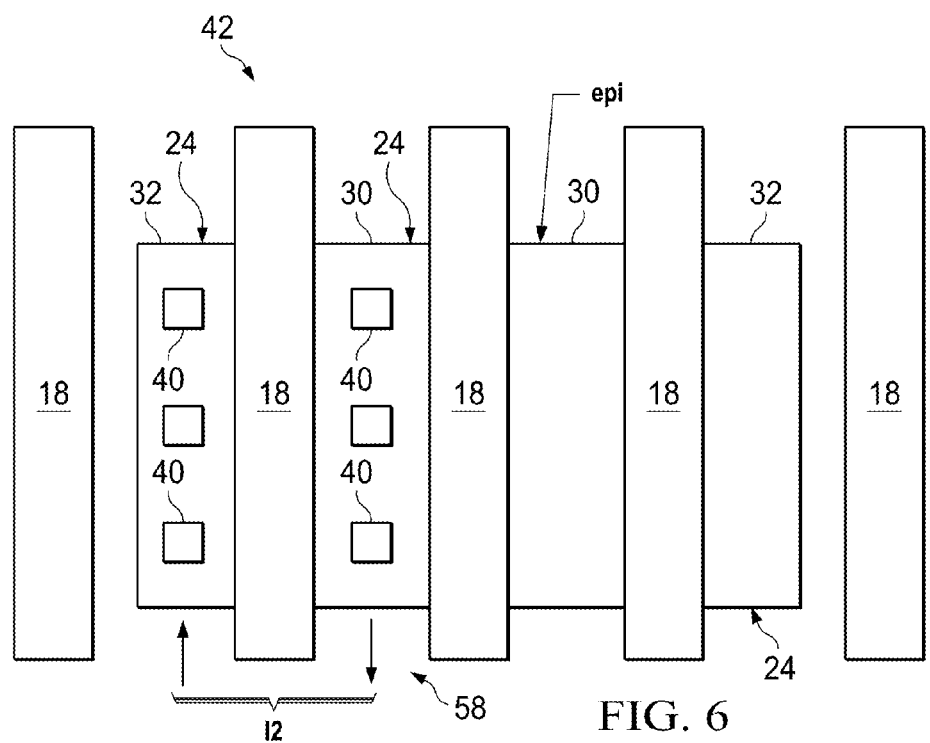
FIG. 6 is a plan view of the FinFET of FIG. 5 further illustrating an orientation of the contacts.

As shown in FIGS. 5-6, the contacts 40 from the second FinFET device 42 are electrically coupled to one of the larger portions 30 of semiconductor material 24 and one of the smaller portions 32 of semiconductor material 24. The contacts 40 may be used to measure currents passing through the smaller and larger portions 30, 32 of semiconductor material 24. In some embodiments, the contacts 40 are formed from tungsten plugs.

In some embodiments, the first FinFET device 28 of FIG. 3 and the second FinFET device 42 of FIG. 5 are combined into a single FinFET device. In such embodiments, the contacts 40 are electrically coupled to both of the larger portions 30 of semiconductor material 24 and at least one of the smaller portions 32 of semiconductor material 24. The contacts 40 may also be electrically coupled to all of the larger and smaller portions 30, 32.

Figure 7:
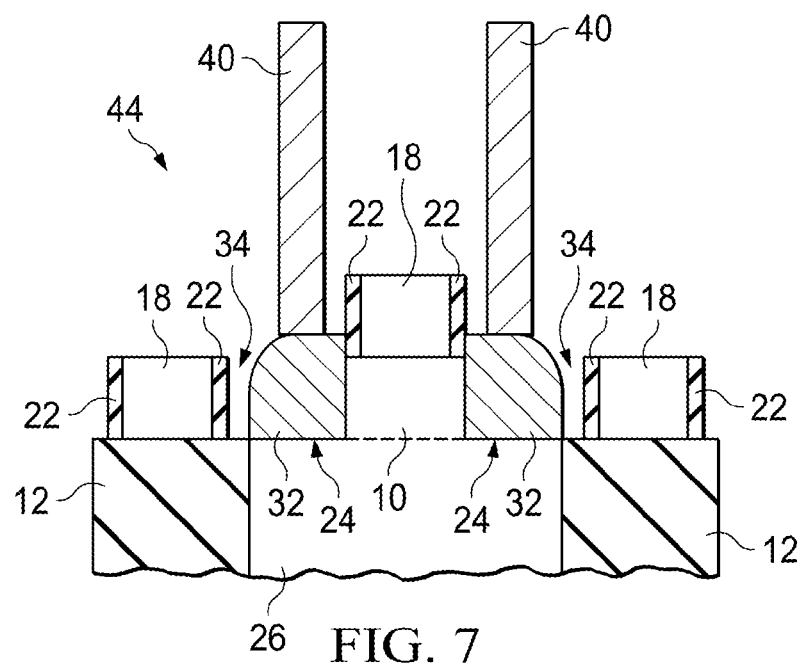
FIG. 7 is a cross sectional view of a third FinFET device constructed in a manner similar to the FinFET device of FIG. 3 and FIG. 5 but with contacts in a third configuration.
Figure 8:
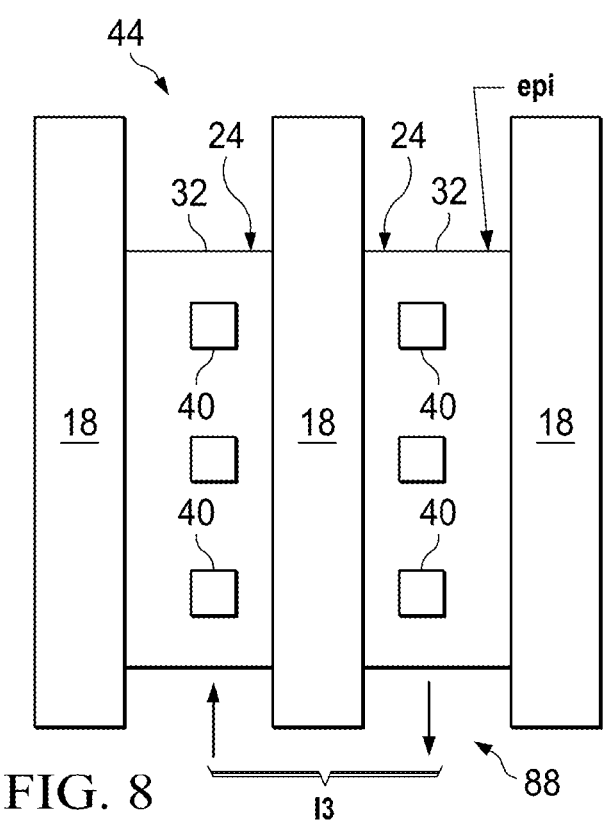
FIG. 8 is a plan view of the FinFET of FIG. 7 further illustrating an orientation of the contacts.

Referring now to FIG. 7, a third FinFET device 44 similar to the first and second FinFET devices 28, 42 of FIG. 3 and FIG. 5, respectively, is illustrated. Unlike the first and second FinFET devices 28, 42, the third FinFET device 44 includes smaller portions 32 of semiconductor material 24. As shown in FIGS. 7-8, the contacts 40 are electrically coupled to the smaller portions 32 of semiconductor material 24. In some embodiments, the contacts 40 are formed from tungsten plugs.

Figure 9:
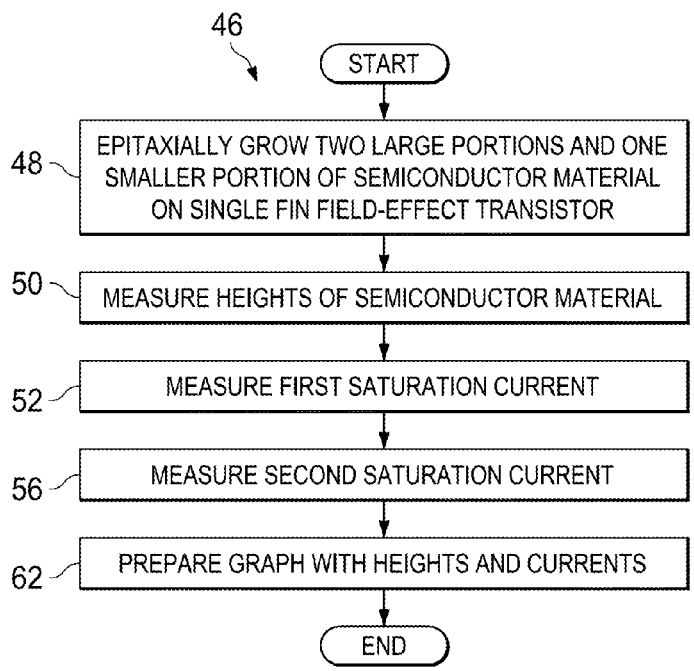
FIG. 9 is a flow chart illustrating a method of estimating a height of epitaxially grown semiconductor material in other semiconductor devices.

Referring now to the flow chart of FIG. 9, a method 46 of estimating a height of epitaxially grown semiconductor material in other semiconductor devices (e.g., devices other than those in FIGS. 3-8) is illustrated. Those skilled in the art will recognize that the method 46 of FIG. 9 refers to an embodiment where the first FinFET device 28 of FIG. 3 and the second FinFET device 42 of FIG. 5 have been combined into a single FinFET device with contacts on both the smaller and larger portions 30, 32 of semiconductor material 24.

Still referring to FIG. 9, in block 48 two of the larger portions 30 of semiconductor material 24 and one of the smaller portions of semiconductor material 24 are epitaxially grown on a single semiconductor device. As noted above, the smaller portion 32 of semiconductor material 24 has a reduced size relative to the larger portions 30 of semiconductor material 24. In block 50, the height 38 of the smaller portion 32 of semiconductor material 24 and the height 36 of one of the larger portions 30 of semiconductor material 24 are each measured. In some embodiments, a transmission electron microscope (TEM) is employed to determine the heights 36, 38.

In block 52, a first saturation current 54 (FIG. 4) through the larger portions 30 of semiconductor material is measured using the contacts 40 arranged in the orientation shown in FIGS. 3-4. When the first saturation current 54 is measured, in some embodiments the center gate electrode 18 operates as a gate, the larger portion 30 of semiconductor material 24 to the right of the center gate electrode 18 operates as a source, and the larger portion 30 of semiconductor material 24 to the left of the center gate electrode 18 operates as a drain.

In block 56, a second saturation current 58 (FIG. 6) through one of the larger portions 30 and one of the smaller portions 32 of semiconductor material 24 is measured using the contacts 40 arranged in the orientation shown in FIGS. 5-6. When the second saturation current 58 is measured, in some embodiments the gate electrode 18 to the left of center operates as a gate, the larger portion 30 of semiconductor material 24 to the right of the gate electrode 18 operates as a source, and the smaller portion 32 of semiconductor material 24 to the left of the gate electrode 18 operates as a drain.

Figure 10:
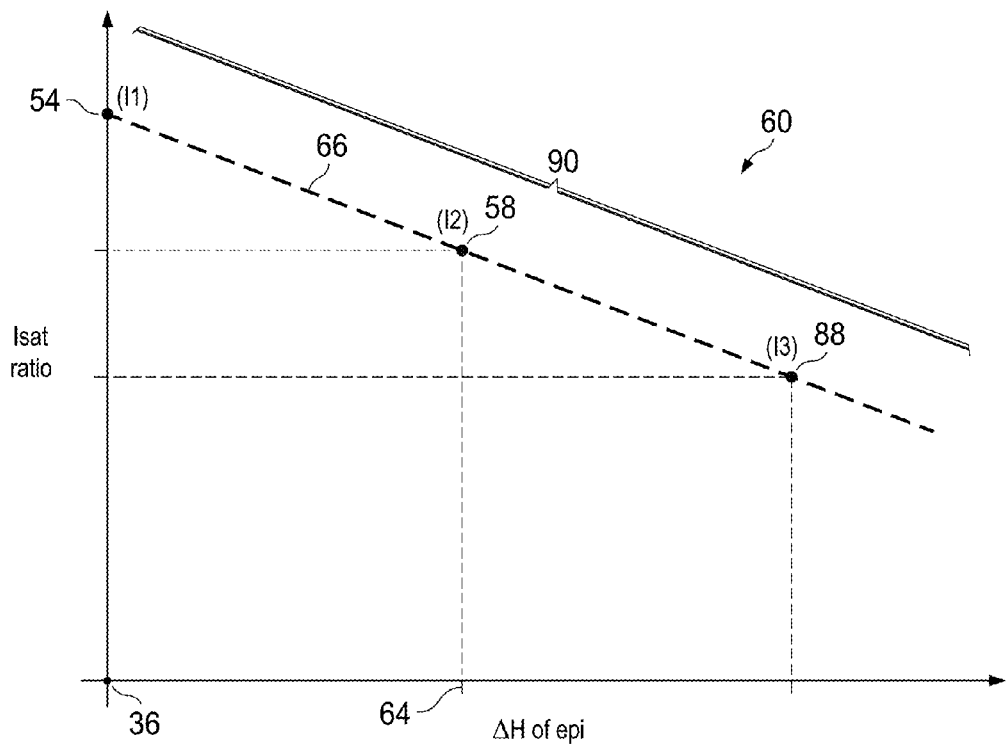
FIG. 10 is a model in the form of a graphical representation (e.g., a chart) illustrating a relationship between saturation currents and heights of epitaxially grown semiconductor material that can be used to estimate a height of an epitaxial layer in other semiconductor devices.

Knowing the heights 36, 38 and first and second saturation currents 54, 58, a model 60 (e.g., a graph, chart, etc.) as depicted in FIG. 10 is prepared in block 62. Referring to FIG. 10, the first saturation current 54 is shown relative to the height 36 of the larger portion 32 of semiconductor material and the second saturation current 58 is shown relative to an average 64 of the heights 36, 38 of the larger and smaller portions 30, 32 of semiconductor material 24. This produces a line 66 that can be used to estimate the height of an epitaxially grown semiconductor material in the other semiconductor devices. For example, if a saturation current falling between the first and second saturation currents 54, 58 of FIG. 10 is measured in a semiconductor device, the height of an epitaxially grown semiconductor material may be estimated as between the height 36 and the average 64 using the model 60.

Figure 11:
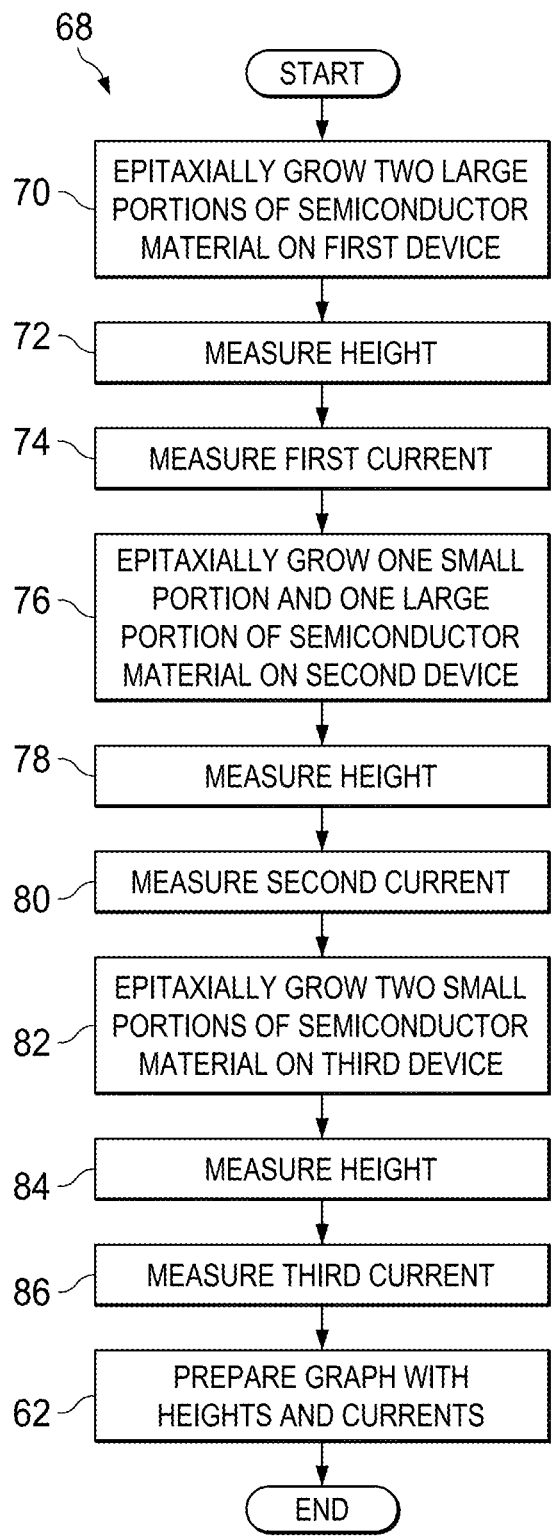
FIG. 11 is a flow chart illustrating another method of estimating a height of epitaxially grown semiconductor material in other semiconductor devices.

Referring now to the flow chart of FIG. 11, another method 68 of estimating a height of epitaxially grown semiconductor material in other semiconductor devices is illustrated. Those skilled in the art will recognize that the method 68 of FIG. 11 refers to an embodiment where the first, second, and third FinFET devices 28, 42, 44 are each used. In some embodiments, the height 36 of the larger portions 30 of semiconductor material 24 in the first FinFET device of FIGS. 3 is the same or similar to the height 36 of the larger portions 30 of semiconductor material 24 in the second FinFET device 42 of FIG. 5. Likewise, the height 38 of the smaller portions 32 of semiconductor material 24 in the first FinFET device 28 of FIG. 5 is the same or similar to the height 38 of the smaller portions 32 of semiconductor material 24 in the second FinFET device 42 of FIG. 7.

Still referring to FIG. 11, in block 70 two of the larger portions 30 of semiconductor material 24 are epitaxially grown on the first FinFET device 28. In block 72, the height 36 of one of the larger portions 30 of semiconductor material 24 is measured. In some embodiments, a transmission electron microscope (TEM) is employed to determine the heights. Thereafter, in block 74 a first saturation current 54 (FIG. 4) through the larger portions 30 of semiconductor material 24 is measured. When the first saturation current 54 is measured, in some embodiments the center gate electrode 18 operates as a gate, the larger portion 30 of semiconductor material 24 to the right of the center gate electrode 18 operates as a source, and the larger portion 30 of semiconductor material 24 to the left of the center gate electrode 18 operates as a drain.

In block 76, one of the smaller portions 32 of semiconductor material 24 and one of the larger portions 30 of semiconductor material 24 are epitaxially grown on the second FinFET device 42. In block 78, the height 38 of the smaller portion 32 of semiconductor material 24 and the height 36 of one of the larger portions 30 of semiconductor material 24 are measured and the average height 64 is determined. Thereafter, in block 80 a second saturation current 58 (FIG. 6) through the smaller and larger portions 32, 30 of semiconductor material 24 is measured. When the second saturation current 58 is measured, in some embodiments the gate electrode 18 to the left of center operates as a gate, the larger portion 30 of semiconductor material 24 to the right of the gate electrode 18 operates as a source, and the smaller portion 32 of semiconductor material 24 to the left of the gate electrode 18 operates as a drain.

In block 82, two of the smaller portions 32 of semiconductor material 24 are epitaxially grown on the third FinFET device 44. In block 84, the height 38 of one of the smaller portions 32 of semiconductor material 24 is measured. Thereafter, in block 86 a third saturation current 88 (FIG. 8) through the smaller portions 32 of semiconductor material 24 is measured. When the third saturation current 88 is measured, in some embodiments the center gate electrode 18 operates as a gate, the smaller portion 32 of semiconductor material 24 to the right of the center gate electrode 18 operates as a source, and the smaller portion 32 of semiconductor material 24 to the left of the center gate electrode 18 operates as a drain.

Knowing the heights 36, 38 (including the averaged heights) and the first, second, and third saturation currents 54, 58, 88, the model 60 (e.g., a graph or chart) as depicted in FIG. 10 is prepared in block 62. Referring to FIG. 10, the first saturation current 54 is shown relative to the height 36 of the larger portion 30 of semiconductor material 24, the second saturation current 54 is shown relative to an average of the height 64 of the larger and smaller portions 30, 32 of semiconductor material 24, and the third saturation current 88 is shown relative to the height 38 of the smaller portion 32 of semiconductor material 24. This produces a curve 90 (e.g., three points) that can be used to estimate the height of an epitaxially grown semiconductor material in the other semiconductor devices.

A method of estimating a height of an epitaxially grown semiconductor material in other semiconductor devices comprises epitaxially growing first, second, and third portions of semiconductor material on a first semiconductor device. The third portion of semiconductor material has a reduced size relative to the first and second portions of semiconductor material. The method continues with measuring a height of the third portion of semiconductor material and a height of at least one of the first and second portions of semiconductor material, measuring a first saturation current through the first and second portions of semiconductor material, and measuring a second saturation current through the first and third portions of semiconductor material. Thereafter, the method includes preparing a model of the first saturation current relative to the height of at least one of the first and second portions of semiconductor material and the second saturation current relative to an average of the height of the first and third portions of semiconductor material. The method continues with using the model to estimate the height of an epitaxially grown semiconductor material in the other semiconductor devices.

A method of estimating a height of an epitaxially grown semiconductor material in other semiconductor devices comprising epitaxially growing first and second portions of semiconductor material on a first semiconductor device. The first and second portions of semiconductor material have about the same size. The method continues with measuring a height of at least one of the first and second portions of semiconductor material and measuring a first saturation current through the first and second portions of semiconductor material. Thereafter, the method includes epitaxially growing third and fourth portions of semiconductor material on a second semiconductor device. The third portion of semiconductor material has a reduced size relative to the first, second, and fourth portions of semiconductor material and the fourth portion of semiconductor material has about the same size as the first and second portions of semiconductor material. The method continues with measuring a height of the third portion of semiconductor material and a height of the fourth portion of semiconductor material and measuring a second saturation current through the third and fourth portions of semiconductor material. Thereafter, the method includes epitaxially growing fifth and sixth portions of semiconductor material on a third semiconductor device. The fifth and sixth portions of semiconductor material have about the same size. Then, the method continues with measuring a height of at least one of the fifth and sixth portions of semiconductor material and measuring a third saturation current through the fifth and sixth portions of semiconductor material. Thereafter, the method includes preparing a model of the first saturation current relative to the height of at least one of the first and second portions of semiconductor material. The second saturation current is relative to an average of the height of the third and fourth portions of semiconductor material and the third saturation current is relative to the height of at least one of the fifth and sixth portions of semiconductor material. Then, the method includes using the model to estimate the height of an epitaxially grown semiconductor material in the other semiconductor devices.

A system for estimating a height of an epitaxially grown semiconductor material in other semiconductor devices comprises a first semiconductor device having first, second, and third portions of epitaxially grown semiconductor material. The first and second portions of epitaxially grown semiconductor material have a first height and the third portion of epitaxially grown semiconductor material have a second height, the second height less than the first height. The system also includes a second semiconductor device having fourth and fifth portions of epitaxially grown semiconductor material. The fourth and fifth portions of epitaxially grown semiconductor material have approximately the second height.

The system also includes contacts electrically coupled to the first, second, third, fourth, and fifth portions of epitaxially grown semiconductor material. The system includes a model illustrating a first saturation current passing through the contacts electrically coupled to the first and second portions of epitaxially grown semiconductor material relative to the first height, a second saturation current passing through the contacts electrically coupled to the first and third portions of epitaxially grown semiconductor material relative to an average of the first and second heights, and a third saturation current passing through the contacts electrically coupled to the fourth and fifth portions of epitaxially grown semiconductor material relative to the second height.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of estimating a height of an epitaxially grown semiconductor material in other semiconductor devices, comprising:
   epitaxially growing first, second, and third portions of semiconductor material on a first semiconductor device, the third portion of semiconductor material having a reduced size relative to the first and second portions of semiconductor material;
   measuring a height of the third portion of semiconductor material and a height of at least one of the first and second portions of semiconductor material;
   measuring a first saturation current through the first and second portions of semiconductor material;
   measuring a second saturation current through the first and third portions of semiconductor material;
   preparing a model of the first saturation current relative to the height of at least one of the first and second portions of semiconductor material and the second saturation current relative to an average of the height of the first and third portions of semiconductor material; and
   using the model to estimate the height of an epitaxially grown semiconductor material in the other semiconductor devices.

2. The method of claim 1, further comprising forming the third portion of semiconductor material adjacent to an environment that inhibits epitaxial growth.

3. The method of claim 1, further comprising forming the third portion of semiconductor material adjacent to at least one of silicon nitride and an oxide.

4. The method of claim 1, further comprising establishing a line on the model using the first and second saturation currents.

5. The method of claim 1, further comprising epitaxially growing fourth and fifth portions of semiconductor material on a second semiconductor device, the fourth and fifth portions of semiconductor material having a similar size as the third portion of semiconductor material, measuring a height of at least one of the fourth and fifth portions of semiconductor material, measuring a third saturation current through the fourth and fifth portions of semiconductor material, and preparing the model to include the third saturation current relative to the height of at least one of the fourth and fifth portions of semiconductor material.

6. The method of claim 5, further comprising establishing a curve in the model using the first, second, and third saturation currents.

7. The method of claim 1, further comprising forming a first gate electrode upon a portion of semiconductor fin interposed between the first and second portions of semiconductor material.

8. The method of claim 7, further comprising forming a second gate electrode upon a portion of semiconductor fin interposed between the first and third portions of semiconductor material.

9. The method of claim 1, further comprising contacting each of the first, second, and third portions of semiconductor material with a tungsten plug to facilitate measurement of the first and second saturation currents.

10. The method of claim 1, further comprising disposing a first set of spaced apart contacts upon the first portion of semiconductor material, a second set of spaced apart contacts upon the second portion of semiconductor material, and a third set of spaced apart contacts upon the third portion of semiconductor material to permit measurement of the first and second saturation currents.

11. A system for estimating a height of an epitaxially grown semiconductor material in other semiconductor devices, comprising:
    a first semiconductor device having first, second, and third portions of epitaxially grown semiconductor material, the first and second portions of epitaxially grown semiconductor material having a first height and the third portion of epitaxially grown semiconductor material having a second height, the second height less than the first height;
    a second semiconductor device having fourth and fifth portions of epitaxially grown semiconductor material, the fourth and fifth portions of epitaxially grown semiconductor material having approximately the second height;
    contacts electrically coupled to the first, second, third, fourth, and fifth portions of epitaxially grown semiconductor material; and
    a model illustrating a first saturation current passing through the contacts electrically coupled to the first and second portions of epitaxially grown semiconductor material relative to the first height, a second saturation current passing through the contacts electrically coupled to the first and third portions of epitaxially grown semiconductor material relative to an average of the first and second heights, and a third saturation current passing through the contacts electrically coupled to the fourth and fifth portions of epitaxially grown semiconductor material relative to the second height.

12. The system of claim 11, wherein the third, fourth, and fifth portions of epitaxially grown semiconductor material are adjacent to an environment that inhibits epitaxial growth.

13. The system of claim 12, wherein the first and second portions of epitaxially grown semiconductor material are separated by a gate electrode.

14. The system of claim 13, wherein the first and third portions of epitaxially grown semiconductor material are separated by a second gate electrode.

15. The system of claim 14, wherein the fourth and fifth portions of epitaxially grown semiconductor material are separated by a third gate electrode.

16. A method of estimating a height of an epitaxially grown semiconductor layer, comprising:
    building a FinFET device having at least one epitaxially grown semiconductor portion;

measuring a saturation current through the FinFET device; and estimating the height of the at least one epitaxially grown semiconductor portion based on an empirically derived relationship between the saturation current and the height.

17. The method of claim 16, wherein the step of building the FinFET device further comprises epitaxially growing first, second, and third portions of semiconductor material on a first semiconductor device, the third portion of semiconductor material having a reduced size relative to the first and second portions of semiconductor material.

18. The method of claim 17, wherein the step of measuring the saturation current through the FinFET device further comprises measuring a height of the third portion of semiconductor material and a height of at least one of the first and second portions of semiconductor material.

19. The method of claim 18, wherein the step of estimating the height of the at least one epitaxially grown semiconductor portion based on the empirically derived relationship further comprises measuring a first saturation current through the first and second portions of semiconductor material and measuring a second saturation current through the first and third portions of semiconductor material.

* * * * *